United States Patent
Bilbeisi

(10) Patent No.: US 11,411,558 B2
(45) Date of Patent: Aug. 9, 2022

(54) BUTTON ASSEMBLY

(71) Applicant: GAMESMAN LIMITED, West Sussex (GB)

(72) Inventor: Haitham Bilbeisi, Sussex (GB)

(73) Assignee: GAMESMAN LIMITED, West Sussex (GB)

( * ) Notice: Subject to any disclaimer, the term of this patent is extended or adjusted under 35 U.S.C. 154(b) by 0 days.

(21) Appl. No.: 17/192,422

(22) Filed: Mar. 4, 2021

(65) Prior Publication Data
US 2021/0211130 A1 Jul. 8, 2021

Related U.S. Application Data

(63) Continuation of application No. PCT/GB2019/052470, filed on Sep. 5, 2019.

(30) Foreign Application Priority Data

Sep. 6, 2018 (GB) .............................. GB1814537.5

(51) Int. Cl.
*H03K 17/96* (2006.01)
*H03K 17/965* (2006.01)

(52) U.S. Cl.
CPC ......... *H03K 17/962* (2013.01); *H03K 17/965* (2013.01); *H03K 2217/96015* (2013.01)

(58) Field of Classification Search
CPC .... H03K 17/962; H03K 17/965; H03K 17/96; H03K 17/97; H03K 2217/96015; H01H 5/02; H01H 13/52
See application file for complete search history.

(56) References Cited

U.S. PATENT DOCUMENTS

| | | | | | |
|---|---|---|---|---|---|
| 5,977,888 | A | * | 11/1999 | Fujita | H03K 17/97 341/34 |
| 2006/0131159 | A1 | * | 6/2006 | Kaps | H03K 17/962 200/600 |
| 2006/0212251 | A1 | * | 9/2006 | Dreyer | H03K 17/962 702/116 |
| 2018/0321640 | A1 | * | 11/2018 | Miyoshi | G06F 3/0362 |

FOREIGN PATENT DOCUMENTS

| | | |
|---|---|---|
| DE | 102009000383 A1 | 4/2021 |
| JP | 3073175 B2 | 8/2000 |
| JP | 2014207207 A | 10/2014 |

OTHER PUBLICATIONS

International Searching Authority. International Search Report and Written Opinion for application PCT/GB2019/052470. dated Mar. 13, 2020. 19 pages.

* cited by examiner

*Primary Examiner* — Alexander Eisen
*Assistant Examiner* — Kebede T Teshome
(74) *Attorney, Agent, or Firm* — Quarles & Brady LLP; Yakov S. Sidorin

(57) ABSTRACT

A button assembly 1 for a substrate 2 includes a chassis 3 attachable to the substrate 2, a movable button 4 constrained by the chassis 3, one or more button sensors 5 operable to sense the movable button 4, and one or more springs 40 or magnets 6a, 6b. The one or more springs 40 or magnets 6a, 6b are arranged to bias the movable button 4 towards a predetermined position.

19 Claims, 10 Drawing Sheets

BUTTON ASSEMBLY

CROSS-REFERENCE TO RELATED APPLICATIONS

This US application is a continuation from the International Patent Application PCT/GB2019/052470, filed on Sep. 5, 2019 and claiming priority from the application GB 1814537.6 filed on Sep. 6, 2018. The disclosure of each of the above-identified applications is incorporated herein by reference.

TECHNICAL FIELD

The present invention relates to a button assembly, in particular to a button assembly for a substrate. Such a button assembly may have applications in the entertainment, defence, aerospace, medical or other industries.

RELATED ART

Machines, such as electronic machines, having buttons are known and used for a variety of purposes and in a variety of industries, e.g. entertainment, defence, aerospace and medical. Such machines typically include input devices which allow a user to interact with the machine.

Early input devices for use in such machines have included purely mechanical buttons. Although purely mechanical buttons are enjoyed by users due to their tactile feel, a disadvantage of such buttons is that they do not display dynamic media content. Thus, other input devices have been developed which have included liquid crystal display (LCD) decks with touch sensors. Whilst LCD decks with touch sensors can display dynamic media content, a disadvantage such input devices is that they lack the tactile feel of mechanical buttons.

Accordingly, more recent input devices have combined LCD decks and mechanical buttons mounted through holes in the cover glass of the machine. This provides both the tactile feel of the mechanical button as well as a means for displaying dynamic media content. The problem with this solution is that the holes render the glass prone to shattering upon impact during normal use. Furthermore, material ingress through the holes is difficult to prevent and can result in damage to the machine. Additionally, this type of input device has a fairly complex construction and can be difficult to install and maintain. Further, as such button assemblies do not have a low profile they can be cumbersome and inelegant in design. Also, with button assemblies having a significant depth the LCD deck may require positioning further away from the surface of the button assembly than is desirable for optimum viewing of the displayed image. Also, button assemblies having buttons mounted through holes in a substrate are difficult or even impossible to reconfigure, e.g. to provide a different button layout or to use a different size of button.

SUMMARY OF THE INVENTION

It is an object of the present invention to provide a button assembly that at least partially overcomes or alleviates the above issues.

According to a first aspect of the present invention, there is provided a button assembly for a substrate, the button assembly comprising: a chassis attachable to the substrate; a movable button constrained by the chassis; one or more button sensors operable to sense the movable button; and one or more biasing assemblies; wherein the one or more biasing assemblies are arranged to bias the movable button towards a predetermined position.

The biasing assembly may be or include any type of member, mechanism or assembly to bias the movable button towards the predetermined position including one or more magnetic assemblies or magnets, or one or more deformable elements or assemblies such as springs or resilient membranes or diaphragms for example.

The one or more biasing assemblies provide a biasing force which retains the movable button in the predetermined position (e.g. a rest or home position) and which must be at least partially overcome on order to allow the movable button to be moved away from the predetermined position.

To engage the button a user has to apply a sufficient force thereto to overcome the biasing force. Thus, the button assembly includes a movable button with a tactile feel, similar to that of a mechanical button. Also, the button assembly provides a substrate on which, in which, or through which media content may be displayed. The button is movable relative to the chassis and irremovable from the chassis during normal use (e.g. not during maintenance work). During normal use, the chassis and movable button are essentially irremovable from the substrate (e.g. not during maintenance work). This improves security and protects the button assembly against damage by tampering. A further advantage is that multiple button assemblies can be installed on a single panel. This allows for a wide variety of button combinations and panel designs to be used. Thus, the layout or configuration of the buttons can easily be adapted.

The substrate may be opaque, transparent or translucent. The substrate may comprise glass, plastics, metals, woods, ceramics or combinations thereof. Non-limiting examples of plastics are thermoplastics, thermosets and combinations thereof. The plastics may be injection moulded and/or machine moulded. A non-limiting example of a thermoplastic is poly(methyl methacrylate) (i.e. acrylic). The substrate may comprise a composite material. The substrate may be arranged between the chassis and the one or more button sensors.

The substrate may comprise a display screen, image projection means or other illuminating means. The substrate may be provided over a display screen, image projection means or other illuminating means. The substrate may comprise, or be provided over, a display screen, image projection means or other illuminating means. The display screen may be selected from a liquid crystal display (LCD), light emitting diode (LED) display, organic light emitting diode (OLED) display, plasma display, static artwork display or the like. The display screen may be flexible or rigid. The substrate may comprise a touchscreen, touch display or other touch device.

The button assembly may comprise the substrate.

The chassis may be securely fixed to the substrate. For example, this may be achieved using screws, clips and/or other fastening means.

The chassis may be bonded to the substrate. The chassis may be bonded to the substrate by an adhesive, an adhesive tape or a combination thereof. Non-limiting examples of suitable adhesives include UV curing adhesives, visible light curing adhesives, epoxy adhesives, cyanoacrylate adhesives, silicone adhesives, polymer adhesives and mixtures thereof. Non-limiting examples of suitable adhesive tapes include single sided adhesive-backed films and double sided adhesive-backed films. Where the chassis is bonded to the substrate, the substrate does not require a hole to be projected therethrough (underneath the chassis) to accommodate the movable button. As a result, the button assembly has improved structural integrity (as it is less prone to shattering) and protects against damage by material ingress.

The chassis may comprise a base and a flange. The flange may be releasably attached to the base. In this way, the button may be deconstructed for maintenance by removing the flange from the base. The flange may be dimensioned to constrain the movable button. The flange may project over, and the base may project under, a portion of the movable button so as to constrain the movable button between the base and the flange. Where the base projects under a portion of the movable button, the base can protect the substrate from damage during normal use. The chassis may comprise an aperture through which the movable button is accessible.

The chassis may be formed from any suitable material, including but not limited to metals, metal alloys, plastics, woods, ceramics or combinations thereof. Non-limiting examples of plastics are thermoplastics, thermosets and combinations thereof. The plastics may be injection moulded and/or machine moulded. A non-limiting example of a thermoplastic is poly(methyl methacrylate) (i.e. acrylic). The chassis may comprise a composite material.

In an embodiment, the chassis is a multiple component chassis.

The chassis may comprise a base and a flange. The base will typically attach to or relative to the substrate. The base may be formed from one or more base parts. The base is preferably annular in configuration, defining a central opening, preferably spanned by the button.

The flange is preferably removably attached to the base, for example using one or more threaded fasteners. The flange is preferably annular in configuration. The flange may be formed from one or more flange parts. The flange will preferably extend laterally into the central opening defined by the base to define an outer limit of movement of the button.

A cover may be provided. The cover is preferably annular in configuration. The cover may be formed from one or more cover parts. The cover will preferably be removably mounted relative to the base and/or the flange. Preferably, the cover will at least partially cover the base and the flange in order to provide an aesthetically pleasing finish to the button assembly. A part of the base and the flange may show around the cover, but the cover will preferably cover any connection or mounting mechanism for connecting/attaching/mounting the flange to the base.

In an embodiment, the chassis may comprise a base with an outer bezel. The base will typically attach to or relative to the substrate. The base may be formed from one or more base parts. The base is preferably annular in configuration, defining a central opening, preferably spanned by the button.

In an embodiment, the base comprises an outer stop skirt. The stop skirt preferably extends radially on an outer side of the base. The stop skirt is preferably shaped to provide a surface to limit the movement of the outer bezel toward the substrate. An outermost guide return may be provided to assist with the location of the outer bezel relative to the base. At least one portion of the lower edge of the stop skirt is preferably spaced from the substrate. The or each spaced lower edge of the stop skirt is preferably planar such that an entryway is formed.

The base preferably includes or is associated with a mounting mechanism to removably mount the outer bezel relative thereto. The mounting mechanism may comprise one or more keys that are moveable radially relative to the base in a direction toward to the central opening to attach and detach the outer bezel. The one or more keys are each typically biased radially outwardly. In an extended position, into which the one or more keys are biased, a portion of the one or more keys will preferably engage a portion of the outer bezel to hold the outer bezel relative to the base. Rotation of the outer bezel may be possible when the outer bezel is engaged relative to the base. Any biasing means can be used to bias the one or more keys radially outwardly, but a spring or similar is preferred.

In one form, the one or more keys include an engagement shoulder to engage with a portion of the outer bezel. An angled portion may be provided on the one or more keys to allow force directed toward the substrate to be translated into lateral movement of the one or more keys radially inwardly.

The outer bezel may be removably attached to the base. The outer bezel is preferably annular in configuration. The outer bezel may be formed from one or more outer bezel parts. The outer bezel will preferably include a flange portion which extends laterally into the central opening defined by the base, to define an upper limit of movement of the button. An upper portion of the flange portion is typically shaped or finished to provide an aesthetically pleasing finish to the button assembly The outer bezel may also include a depending wall portion extending at an angle from the flange portion. The depending wall portion typically diverges radially outwardly from the flange portion. An outer surface of the depending wall portion typically continues on from an outer surface of the flange portion.

The depending wall portion preferably includes an engagement shoulder to engage with the one or more keys to hold the outer bezel relative to the base. An angled portion may be provided on the depending wall portion to allow force directed toward the substrate to be translated into lateral movement of the one or more keys radially inwardly.

In use, depression of the outer bezel toward the substrate will cause the angled portion of the outer bezel to abut the angled portion of the one or more keys, forcing the one or more keys radially inwardly until the engagement shoulder of the outer bezel is aligned with the engagement shoulder of the one or more keys, mounting the outer bezel relative to the base. A tool can be inserted into and through the entryway beneath the spaced lower edge of the stop skirt to abut a portion of the one or more keys to move the one or more keys radially inwardly to disengage the engagement shoulders, allowing separation of the outer bezel from the base for servicing and/or cleaning for example.

Preferably the outer bezel is unitary in construction, typically formed as a single member.

The movable button may be operable to translate vertically, translate horizontally, slide, rotate and/or tilt.

The movable button may be opaque, transparent or translucent. The movable button may be substantially transparent. The movable button may be adapted to act as a lens.

The movable button may comprise a plate-like structure.

The movable button may be formed of a conductive material, reflective material, magnetic material or combinations thereof. The movable button may be coated with a conductive material, reflective material, magnetic material or combinations thereof. The movable button may be plated with a conductive material, reflective material, magnetic material or combinations thereof. The movable button may be formed of glass, plastics, metals, woods, ceramics or combinations thereof. The movable button may be coated with glass, plastics, metals, woods, ceramics or combinations thereof. Non-limiting examples of plastics are thermoplastics and thermosets. The plastics may be injection moulded and/or machine moulded. A non-limiting example of a thermoplastic is poly(methyl methacrylate) (i.e. acrylic). The movable button may comprise a composite material.

The button is preferably unitary. The button is preferably continuous across the central opening in the base. The button will preferably have a top portion and at least one radially extending lip which is stepped from the top portion. An annular lip is preferred. When assembled, the top portion projects through the central opening (as defined by the chassis or one or more components of the chassis), and the annular lip projects under the flange or flange portion and prevents the movable button from being removed from the chassis during normal use.

The movable button may comprise one or more detectable elements for sensing by the one or more button sensors.

The button assembly may comprise a pivoting means about which the movable button can pivot. In some applications, provision of the pivoting means can result in better controlled movement of the movable button. For example, the pivoting means can aid control of the tilting movement. The pivoting means may be located underneath the movable button. The pivoting means may be incorporated in the chassis. The pivoting means may be a rocker device; V-groove pivoting means; tongue and groove pivoting means; pin, shaft and hole pivoting means; or a biasing pivoting means such as spring fixing pivoting means or magnetic fixing pivoting means.

An advantage of the movable button is that it can provide a noticeable "tick" feel (e.g. similar to that of a microswitch) upon being pressed. A kinaesthetic, haptic or tactile feedback cue can be provided by the movement of the movable button by provision of a such as a static bump feature, flexible bump feature (leaf spring) or compressible feature such as a collapsible membrane or metal diaphragm for example.

The button assembly may comprise a rotary bezel. Where present, the rotary bezel provides an additional input means (in addition to the movable button). The rotary bezel may be operable to control a function in a machine or system. In some embodiments, the rotary bezel may be operable to control a function in an entertainment, defence, aerospace or medical machine or system. Examples of such functions include but are not limited to: volume setting, brightness setting, zoom in/out function, tracking movement function, or the like.

For example, the rotary bezel could be used to control the movement of an object in an arcade game.

The rotary bezel may be rotatably mounted on the chassis (e.g. by means of a screw and thread mounting). The rotary bezel may be secured in position by the flange of the chassis. The rotary bezel may comprise an aperture through which the movable button is accessible.

The rotary bezel may be formed of a conductive material, reflective material, magnetic material or combinations thereof. The rotary bezel may be coated with a conductive material, reflective material, magnetic material or combinations thereof. The rotary bezel may be plated with a conductive material, reflective material, magnetic material or combinations thereof. For example, the rotary bezel may comprise a metal coating or plating. For example, the rotary bezel may comprise a chrome coating or plating. The rotary bezel may comprise one or more detectable elements for sensing by the one or more button sensors. That is, the one or more button sensors may be operable to sense the rotary bezel via the one or more sensory elements.

In another embodiment, the movable button may be provided with a radially extending cover portion extending radially from the top portion, to cover the base. The outer part of the cover portion is preferably spaced from the base The base preferably includes or is associated with an abutment shoulder. Preferably the abutment shoulder is associated with a lateral return. The lateral return may be provided within or as a part of an opening in or into the base.

The cover portion may comprise a depending wall portion extending at an angle from the flange portion. Preferably the depending wall extends perpendicularly from an underside of the cover portion.

The cover portion preferably includes an engagement shoulder to releasably engage with the abutment shoulder of the base. The engagement shoulder is preferably provided on the depending wall portion.

The depending wall is preferably provided with an angled portion to allow force directed toward the substrate to be translated into lateral deflection of the depending wall portion radially inwardly.

The movable button may be unitary in construction, typically formed as a single member.

In use, depression of the movable button toward the substrate will cause the angled portion of the depending wall to abut the abutment shoulder of the base, forcing lateral deflection of the depending wall portion radially inwardly until the engagement shoulder of the depending wall portion is aligned with the abutment shoulder of the movable button, attaching the movable button relative to the base.

The movable button may be provided with a depending shoulder to define the edge of the actuable portion of the moveable button. The depending shoulder is preferably associated with at least one radially extending mount for mounting the at least one biasing assembly relative to the substrate and the movable button. The at least one biasing assembly will preferably bias the engagement shoulder toward the abutment shoulder. The lateral return will preferably abut the depending wall portion to limit movement of the moveable button to depression and return and rotation.

The one or more detectable elements may be provided as a coating. The coating may be a magnetic coating on the movable button and/or on the rotary bezel. The one or more detectable elements may comprise a magnetic material, conductive material, reflective material or combinations thereof. The one or more detectable elements may be coated with a magnetic material, conductive material, reflective material or combinations thereof. The one or more detectable elements comprise one or more metals. The metal may be chromium.

The one or more button sensors may be arranged in or on or mounted in relation to the substrate.

The one or more button sensors may be operable to sense when the movable button moves vertically, rotates and/or tilts. The one or more button sensors may be operable to sense the rotary bezel. For example, the one or more button sensors may be operable to sense rotation of the rotary bezel.

The one or more button sensors may be of any suitable type. Suitable types of button sensor include but are not limited to a projected capacitive touch (PCAP) sensor, an optic proximity sensor, a Hall Effect sensor and an inductive proximity sensor. An advantage of using these types of sensors is that no hole needs to be projected through the substrate to mount the button thereon. As the skilled person will appreciate, these types of sensors are particularly useful to detect the movable button without any physical contact therewith.

In some embodiments, the one or more button sensors may be photoelectric sensors. The photoelectric sensors may comprise a transmitter operable to transmit a beam to a receiver. The photoelectric sensors may be configured to detect when there is a break in the beam. The photoelectric sensors may be selected from an opposed (through beam) sensor and a retro-reflective sensor. The button assembly may comprise one or more magnets arranged to bias the movable button towards a predetermined position. The predetermined position may be a rest position. That is, a position to which the button returns when it is not engaged.

The one or more magnets may comprise one or more first magnets cooperable with one or more second magnets. In this way, the first and second magnets can be oriented such that they attract or repel each other. The one or more first magnets may be mounted on the movable button. The one or more second magnets may be mounted on the chassis (e.g. the flange). The one or more first magnets and/or the one or more second magnets may be removable. This can facilitate replacement of the magnets for maintenance.

The one or more magnets may comprise a permanent magnet and/or an electromagnet.

A further advantage of using one or more magnets is that the magnets can be selected based on their magnetic strength, and conveniently changed, to tailor the tactility and other characteristics of the movable button as required.

The button assembly may comprise one or more tactility enhancers. Examples of suitable tactility enhances include cushioning means, hard stops, spring mechanisms, collapsible membranes, metal diaphragms, damping mechanisms and materials, and combinations thereof.

Ingress of fluids, liquids and particles through the mounting substrate is preferably prevented as there is no opening in the substrate.

The button assembly is preferably hardened against the ingress of fluids, liquids and particles. Preferably, the assembly will allow for liquid flow management out of the button assembly. The assembly is typically configured to allow ease of maintenance for cleaning and serviceability.

The button assembly may comprise an ingress protection membrane. The ingress protection membrane may be flexible. The ingress protection membrane may be formed of any suitable material as are known to a person skilled in the art. Non-limiting examples of suitable materials include elastomers, rubber and other polymeric materials. The ingress protection membrane may be arranged to form a seal between the movable button and the chassis. The ingress protection membrane may be sealably connected to the chassis at one end and sealably connected to the movable button at the opposite end.

The button assembly may be disassembled and reassembled using a suitable tool. Suitable tools are known to a person skilled in the art. Disassembly of the button assembly may require a tool. This may improve security and serve to guard against tampering.

Non-limiting examples of suitable tools are keys, wrenches and screwdrivers.

The button assembly may be operable to output information on the translational, rotational, sliding and/or tilting movement of the movable button. The output information of the movable button may comprise audio information and/or visual information. The output information of the movable button may be in the form of a signal. The signal may be absolute or incremental.

The button assembly may be operable to output information on the rotational movement of the rotary bezel. The output information of the rotary bezel may comprise audio information and/or visual information. The output information of the rotary bezel may be in the form of a signal. The signal may be absolute or incremental.

The movable button may be provided with audio feedback means operable to output audible sound. The audio feedback means may be operable in response to the one or more button sensors. This can allow the audio feedback means to be actuated in response to the movable button being pressed. The audio feedback means may be mechanically or electronically operable. The audible sound may be an audible 'click', 'ding' or 'bleep'. A person skilled in the art will be aware of suitable audio feedback means.

The aforementioned statements of suitable features and advantages of the first or other aspect apply to any other aspects as described herein, without departing from the scope of the invention.

According to another aspect of the present invention, there is provided a display assembly comprising the button assembly of the first aspect.

The display assembly may comprise the substrate.

According to another aspect of the present invention, there is provided a machine comprising the button assembly of the first aspect.

The machine may be an electronic machine. The machine may be for use in the entertainment, defence, aerospace, medical or other industry.

The machine may be an entertainment machine. The entertainment machine may be any type of entertainment machine that is typically found in the casino or arcade environment. The entertainment machine may be selected from a slot machine, a pinball machine, an arcade machine, an electro-mechanical entertainment machine, a gambling machine and a vending machine.

The machine may comprise the substrate.

BRIEF DESCRIPTION OF THE DRAWINGS

In order that the invention may be more clearly understood, an embodiment thereof will now be described, by way of example only, with reference to the accompanying drawings, in which:

FIG. 3a shows a side component view of the embodiment of FIG. 1a;

FIG. 4 shows an alternative side component view of the embodiment of FIGS. 1 and 1a;

DETAILED DESCRIPTION

Figure 1:
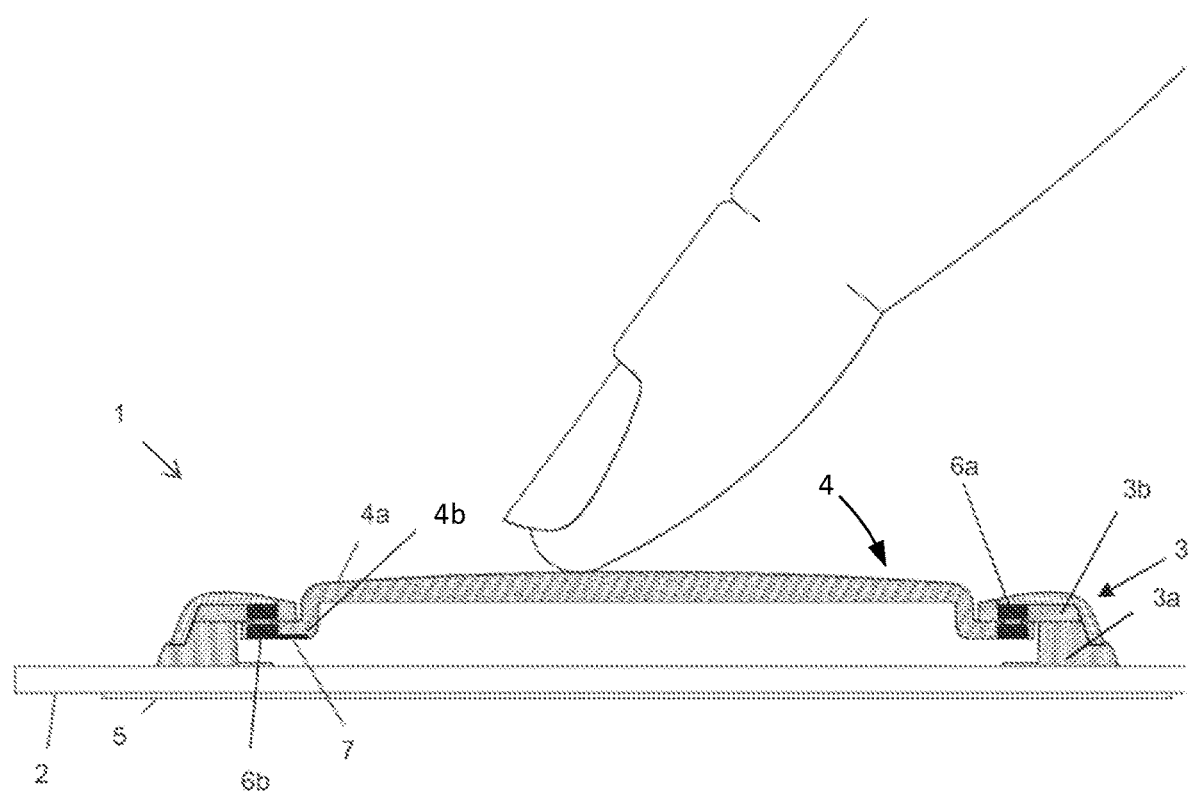
FIG. 1 shows a side view of a simplified button assembly according to an embodiment of the present invention.

With reference to FIGS. 1 to 4, a button assembly 1 comprises a glass panel 2, a chassis 3 attached to the glass panel 2, a movable button 4 constrained by the chassis 3; a sensor (in this embodiment a projected capacitive touch (PCAP) sensor, although the skilled person will appreciate that other sensors may be used) 5 operable to sense the movable button 4; and a plurality of magnets 6a, 6b arranged to bias the button towards a rest position.

The glass panel 2 is arranged in between the button assembly 1 and the proximity sensor 5, such that the chassis 3 and the PCAP sensor 5 are adjacent to, and arranged on opposite sides of, the glass panel 2. As the skilled person will appreciate, the glass panel 2 may form part of the exterior of a machine. When this is the case, the PCAP sensor 5 is located within the machine and the chassis 2 is thus located outside of the machine. In such cases, the panel 2 may be a display panel or control panel of the machine. In such cases, the PCAP 5 may be part of a wider PCAP enabling the remainder of the panel to function as a touchscreen.

Figure 4:
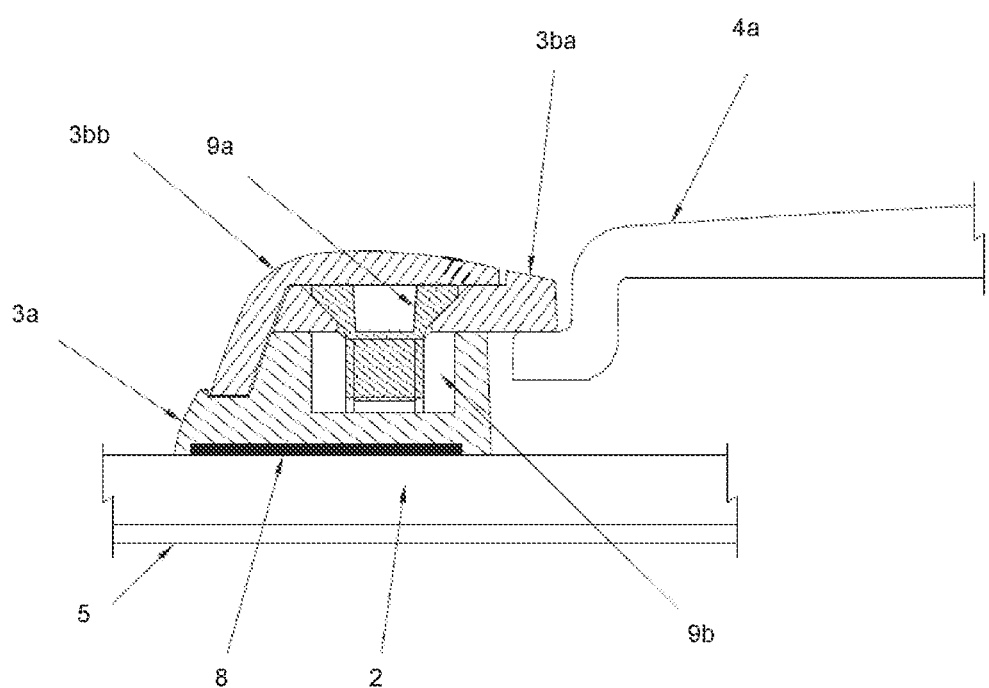

The chassis 3 comprises a base 3a and a flange 3b, which together form an annular structure within which the movable button 4 is constrained. The flange 3b is securely and releasably fastened to the base 3a using screw fasteners (as shown in FIG. 4). However, the skilled person will appreciate that clips or other fastening means may be used. The base 3a is bonded to the glass surface 2 using an adhesive 8. In this arrangement the chassis 3 is irremovable from the glass surface 2 during normal use. The flange 3b projects over, and the base 3a projects under, a portion of the movable button 4. In this way, the flange 3b and base 3a are dimensioned so as to constrain the movable button 4 therebetween. Here, the base 3a can protect the glass surface 2 from damage by movement of the movable button 4. The chassis 3 defines a central aperture through which the movable button 4 is accessible.

The movable button 4 is of a circular form (but, as the skilled person will appreciate, may be of any other form, e.g. triangular, quadrilateral or any other polygon) and comprises a top portion 4a and an annular flange lip 4b which is stepped from the top portion 4a. As shown in FIG. 1, the movable button 4 is biased towards a rest position (as discussed below). In this arrangement the top portion 4a projects through the central aperture (as defined by the chassis), and the annular flange lip 4b projects under the flange 3b and prevents the movable button 4 from being removed from the chassis 2 during normal use.

The plurality of magnets 6 are arranged to bias the movable button 4 towards a rest position. In this position the annular flange lip 4b is in contact with or adjacent to the flange 3b and the movable button 4 is not sensed by the PCAP sensor 5 (i.e. the movable button is not actuated). To achieve the rest position, a plurality of first magnets 6a are mounted on the flange 3b and a plurality of corresponding second magnets 6b are mounted on the annular flange lip 4b, in an orientation such that the magnets 6 bias the annular flange lip 4b towards the flange 3b. Thus, the magnets 6a, 6b, in effect, provide a holding force by which the movable button 4 is retained in the rest position. To engage the movable button 4 a user has to apply a sufficient force thereto (i.e. suitably to the top portion, so as to separate the annular flange lip 4b from the flange 3b) to overcome the holding force. When the movable button 4 is engaged in this manner its movement can be detected by the PCAP sensor 5. As the skilled person will appreciate, the PCAP sensor 5 can be configured to the required sensitivity, which may vary for different applications. For example, the PCAP sensor 5 can be tailored to detect the movable button 5 when it moves within a set distance of the PCAP sensor 5.

In this particular embodiment, a plurality of detectable elements 7 are mounted on the annular flange lip 4b, underneath the second magnets 6b and facing the glass panel 2. The detectable elements 7 allow the movable button 4 to be sensed by the PCAP sensor 5. When the movable button 4 is actuated the detectable elements 7 move towards the PCAP sensor 5 and can be detected.

The movable button 4 may be provided with audio feedback means operable to output audible sound. The audio feedback means may be operable in response to the PCAP sensor 5. This can allow the audio feedback means to be actuated in response to the movable button 4 being pressed. The audio feedback means may be mechanically or electronically operable. The audible sound may be an audible 'click', 'ding' or 'bleep'. A person skilled in the art will be aware of suitable audio feedback means.

The PCAP sensor 5 is formed on the glass surface 2 and is thereby operable to sense when the movable button 4 moves vertically, horizontally, slides, rotates and tilts, by means of the detectable elements 7.

In use, when the movable button 4 is actuated it can move to a distance within which its detectable elements 7 are detected by the PCAP sensor 5. Depending on the particular application, the PCAP sensor 5 can be configured to detect translational, rotational, sliding and/or tilting movement of the movable button, via the detectable elements 7. This movement information can be output by visual means, audio means or any other suitable electronic means (analogue or digital). For example, the PCAP sensor 5 may be arranged in electronic communication with a controller and a display screen, wherein movement information from the PCAP sensor 5 is output in terms of visual or audio means by the display screen via the controller. Optionally, the controller may include a button status output pin (such as a general-purpose input/output (GPIO). This pin can be monitored by the machine. As an example, in use upon actuation of the movable button 4 a machine to which the button assembly 1 is connected may be operative to inform the user of an event, e.g. visually by a display screen and/or audibly by a speaker or mechanical click.

Figure 2:
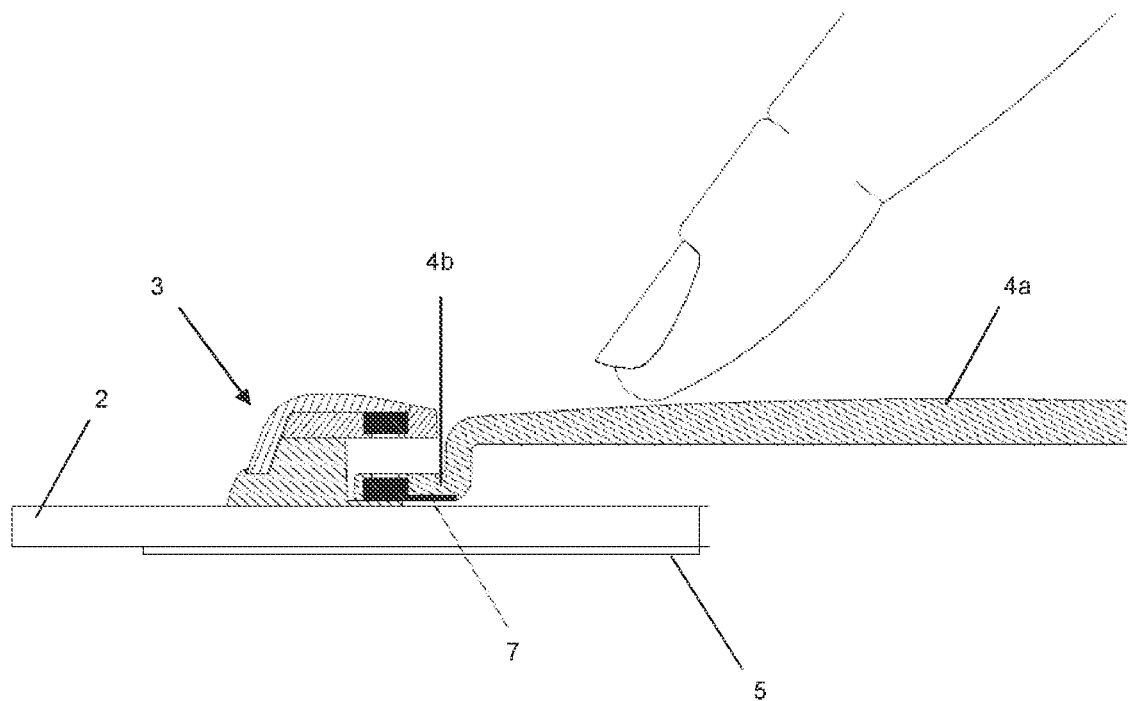
FIG. 2 shows a side view of the embodiment of FIG. 1, where the movable button has been pressed by a user.

With reference to FIG. 2, a user has applied a force to the top portion 4a of the movable button 4 sufficient to overcome the holding force of the magnets 6a, 6b and thus separate the flange 3b from the annular flange lip 4b. Here, the movable button 4 has been actuated and the detectable elements 7 can be sensed by the PCAP sensor 5.

Figure 3:
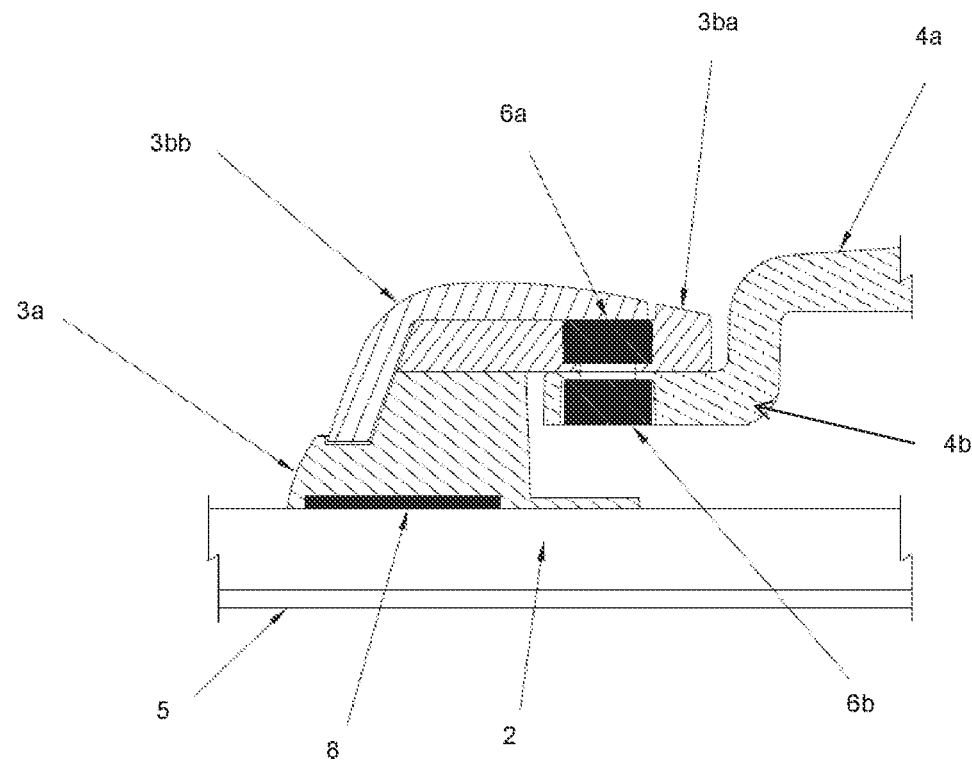
FIG. 3 shows a side component view of the embodiment of FIG. 1.
Figure 3A:
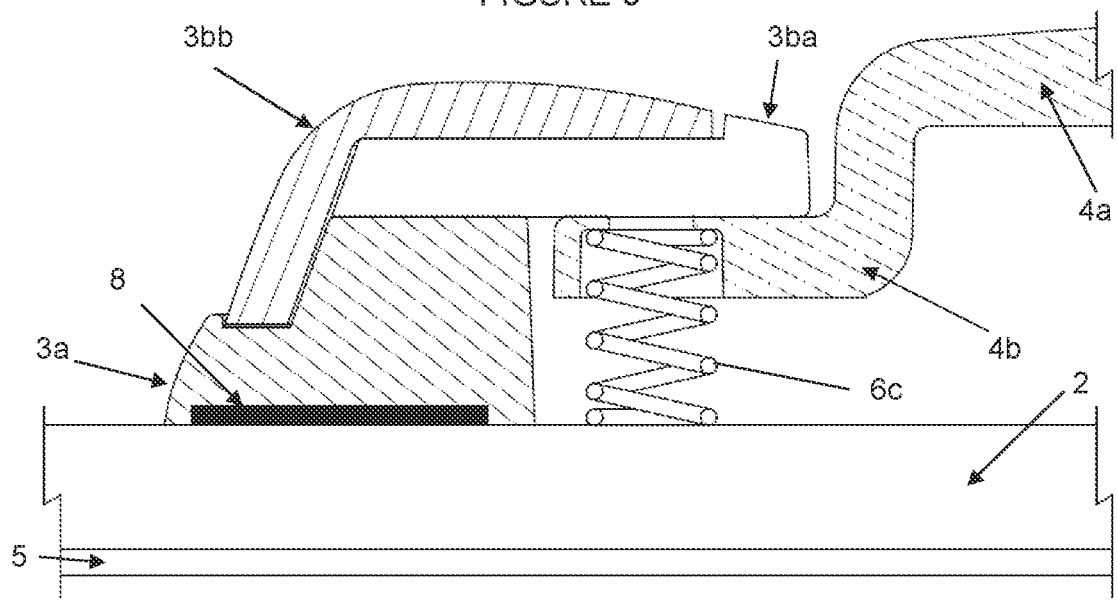

With reference to FIG. 3, the construction of the button assembly 1 of FIG. 1 is shown in detail. Here, it can be seen that the flange 3b is made up of a fixing plate 3ba and a chrome decorative cover 3bb. In this way, the decorative cover 3bb covers the fixing plate 3ba and is the primary visible component of the chassis 2, when viewed from above. Here, it is shown that the magnets 6b are mounted on the fixing plate 4ba. Moreover, the bonding adhesive 8, by which the chassis 3 is bonded to the glass surface 2, is also shown in FIG. 3.

Figure 1A:
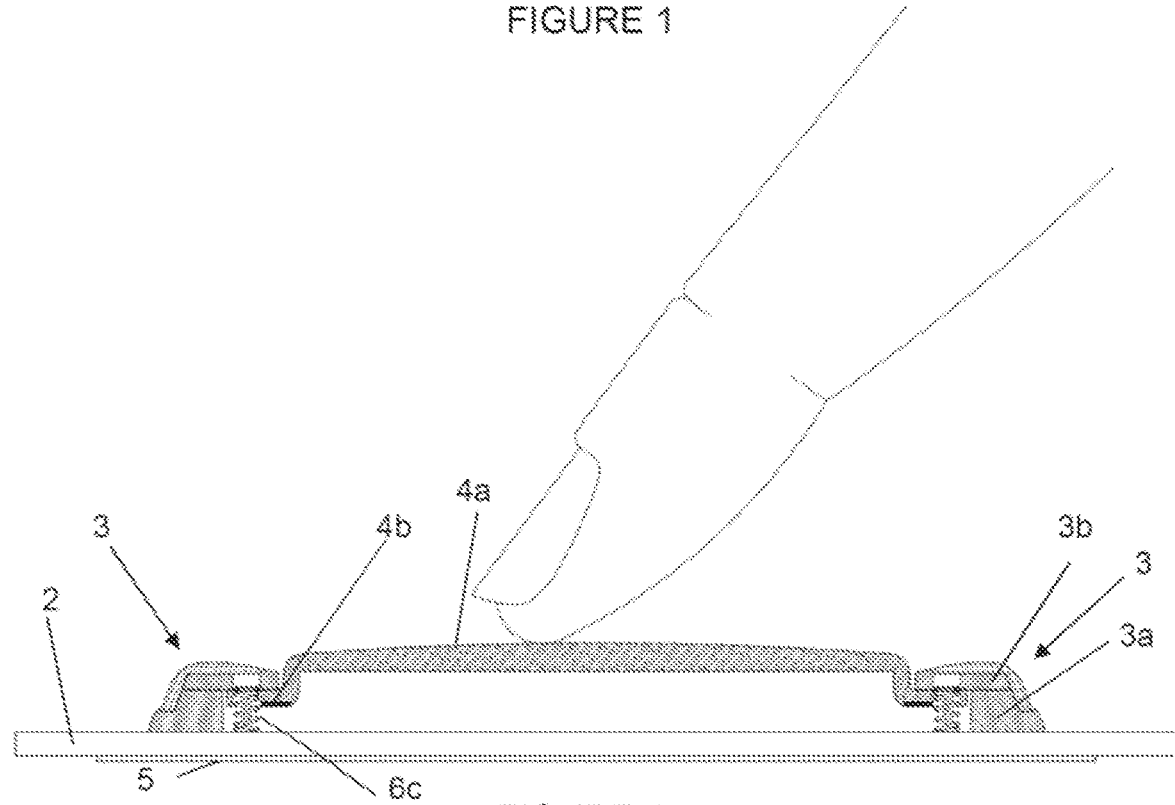
FIG. 1a shows a side view of a simplified button assembly similar to that illustrated in FIG. 1 but with springs 6c instead of magnets.

With reference to FIG. 4, the construction of the button assembly 1 of FIG. 1 is shown in alternative detail. Typically, the attachment illustrated in FIG. 4 is offset circumferentially from the configuration shown in FIGS. 1 and 1a. In FIG. 4, the fixing plate 3ba is securely attached to the base 3a by a series of screw fasteners 9 comprising a screw 9a and a threaded insert 9b (just one screw fastener 9 is shown for simplicity in FIG. 4). However, the skilled person will appreciate that clips or any other fastening means may be used.

Figure 5:
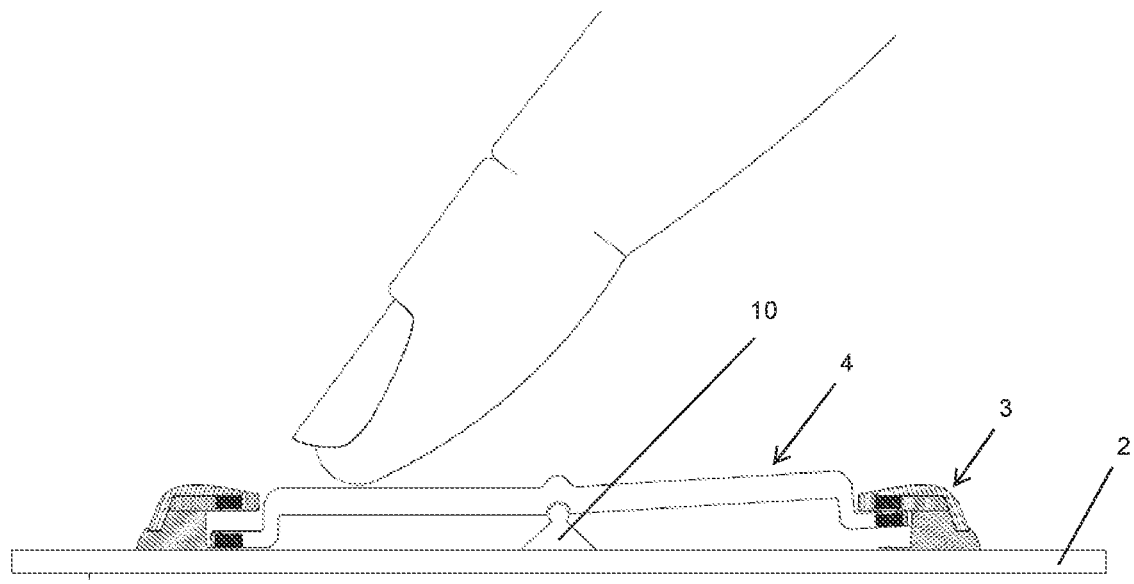
FIG. 5 shows a side view of a simplified button system according to another embodiment of the present invention, where the button assembly comprises a rocker device.
Figure 5A:
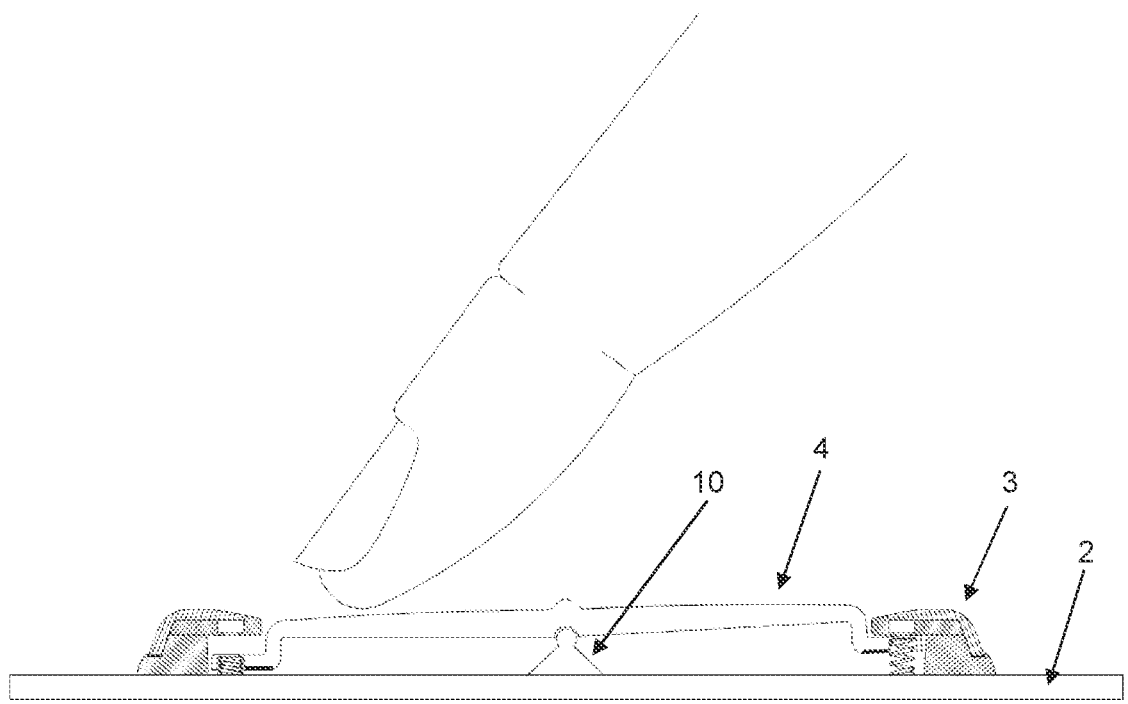
FIG. 5a shows a side view of a simplified button system similar to that illustrated in FIG. 5 but with springs instead of magnets.

With reference to FIG. 5, the button assembly 1 comprises the same components as are present in the embodiment illustrated in FIGS. 1 to 4, except that it is modified to include a rocker device 10 and that its top portion 4a comprises a hemispherical recess at the underside centre surface. The rocker device 10 is substantially conical with a spherical structure at the apex. The base of the rocker switch 10 is fixedly attached to the glass surface 2. The spherical structure and hemispherical recess are dimensioned such that a portion of the spherical structure fits flush with the hemispherical recess. This arrangement allows the movable button 5 to pivot (or tilt/rock) by means the hemispherical recess and the rocker device 10 which permit ball-and-socket-like movement. In particular applications this arrangement can allow for a more controlled movement of the movable button 4.

Figure 6:
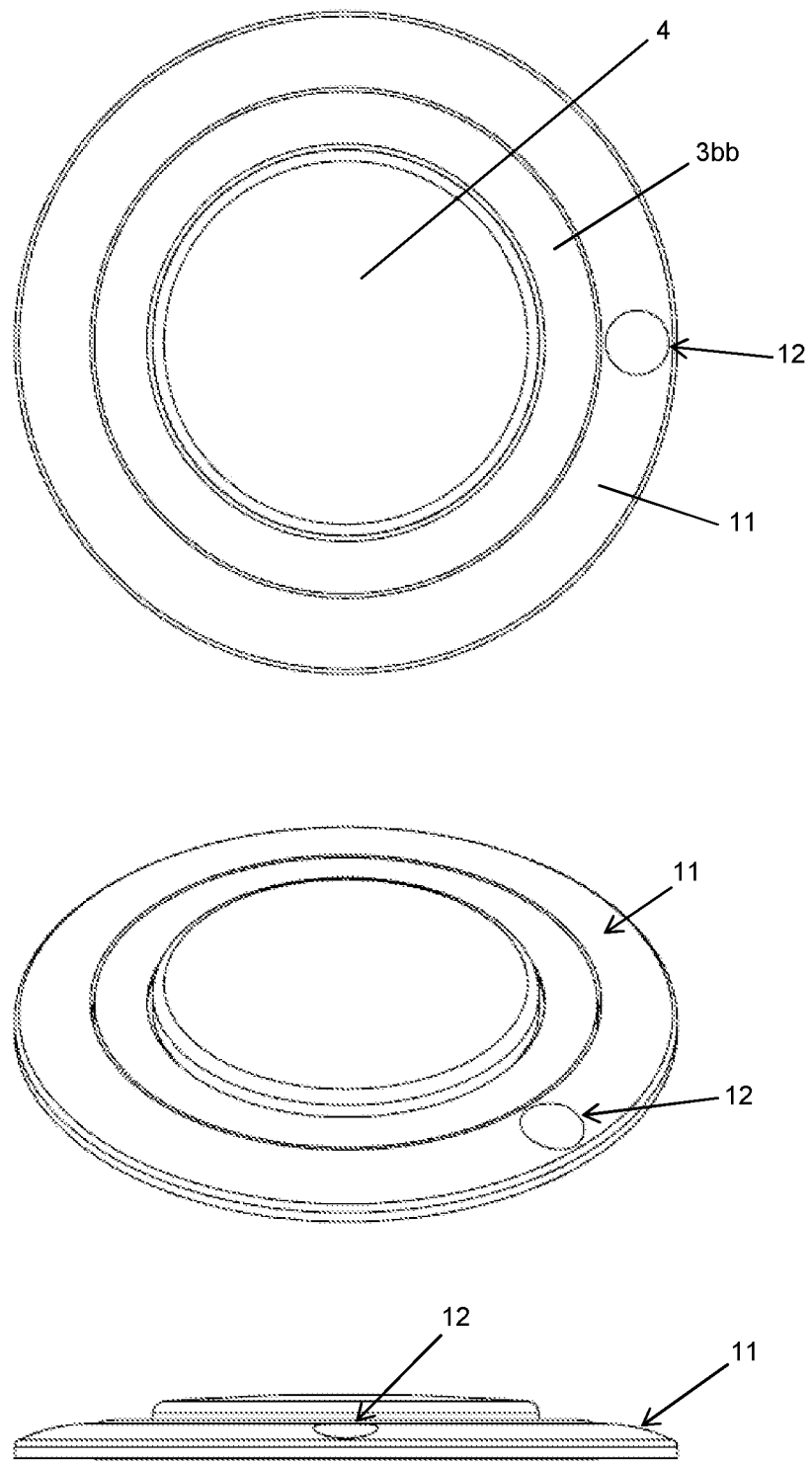
FIG. 6 shows three separate views of a simplified button assembly according to another embodiment of the present invention, where the button assembly comprises a rotary bezel.

With reference to FIG. 6, the button assembly 1 comprises the same components as are present in the embodiment illustrated in FIGS. 1 to 4, except that it is modified to include a rotary bezel 11. The rotary bezel 11 provides an additional input means (i.e. in addition to the movable button 4). The rotary bezel 11 is mounted on the chassis 3 and secured in position by the flange 3b, which projects over a portion of the rotary bezel 11. The rotary bezel 11 is of an annular form and defines a central aperture through which the movable button 4 is accessible. Viewed from above, the rotary bezel 11 and the chassis 3 form overlapping concentric rings, where the rotary bezel 11 forms the outside ring. In this arrangement the movable button 4 and chassis project through the aperture defined by the rotary bezel 11. Furthermore, the rotary bezel 11 comprises a detectable element 12 which can be sensed by the PCAP sensor 5. When the rotary bezel 11 is rotated (e.g. by a user) the rotational movement of the rotary bezel 11 can be detected by the PCAP sensor 5.

Figure 7:
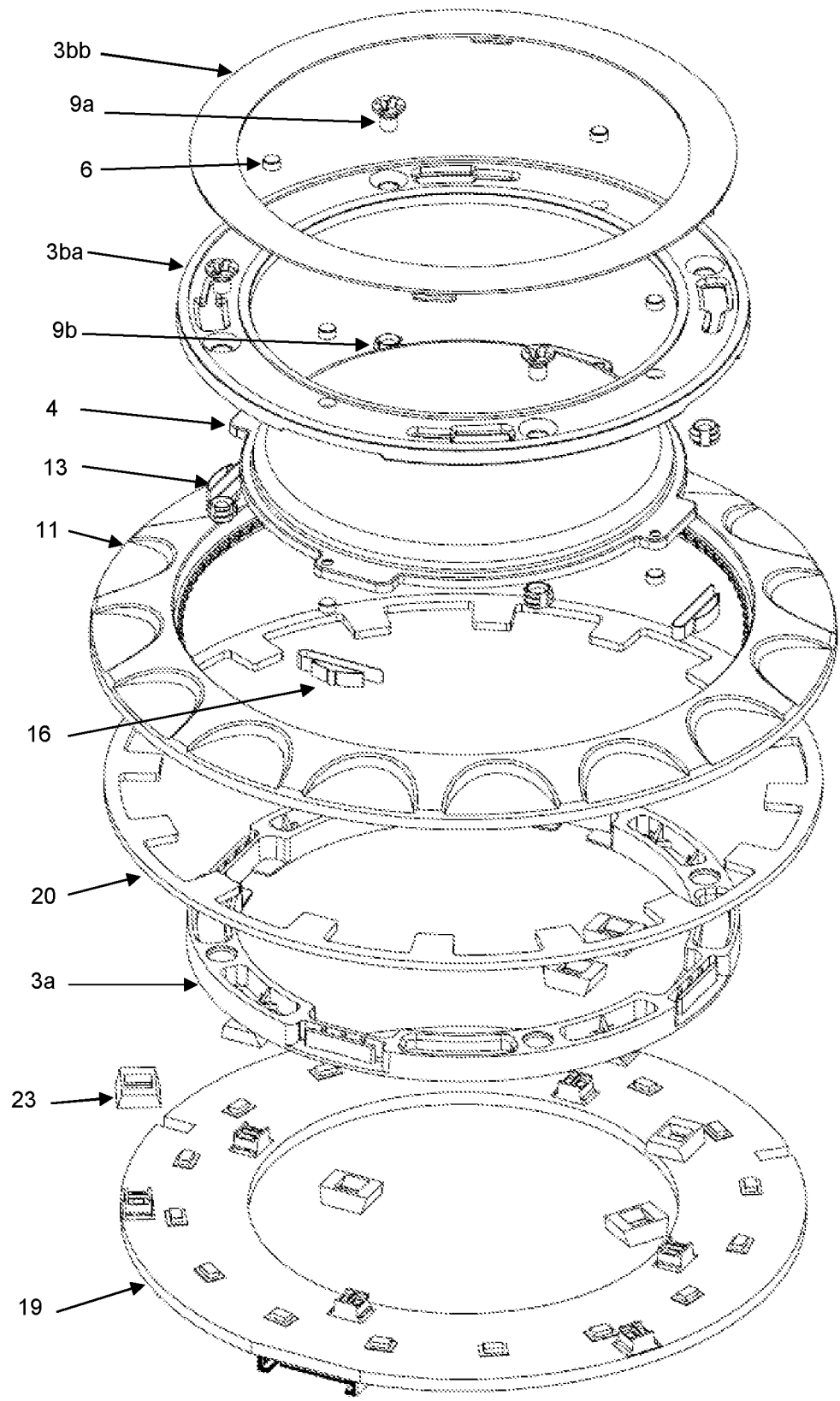
FIG. 7 shows an exploded view drawing of another embodiment of the present invention.

With reference to FIG. 7, an alternative embodiment of the present invention is shown. For clarity, the glass panel 2 is omitted in FIG. 7 but other features common to the previous embodiments retain the same reference numerals and are not described again.

In this alternative embodiment, the PCAP sensor 5 is replaced by an annular base 19 upon which is provided a number of non-capacitive button sensors 23. The non-capacitive button sensors 23 might typically be Hall Effect sensors or optical sensors. The base 19 is attached to the underside of the panel 2 by way of an adhesive or fixing means such as screws or the like. As a further alternative, the base 19 may be mounted to another structure behind the panel 2 such that it is securely located in sufficiently close proximity to the button 4.

The embodiment of FIG. 7 further illustrates the provision of optional elements such as rotational springs 13. The springs 13 help maintain the position of the rotary bezel 11 and provide additional tactile feedback.

The embodiment of FIG. 7 also illustrates the provision of a rotary encoder 20 and rotational spring ratchets 16. The rotary encoder can be fixed to the inner surface of the bezel 11 whilst the ratchets 16 are fixed to the base 3a. In this manner, the bezel 11 is free to rotate around the base 3a in a series of indexable steps. Additionally, the interaction of ratchets 16 and encoder 20 provide additional tactile feedback to a user.

Figure 8:
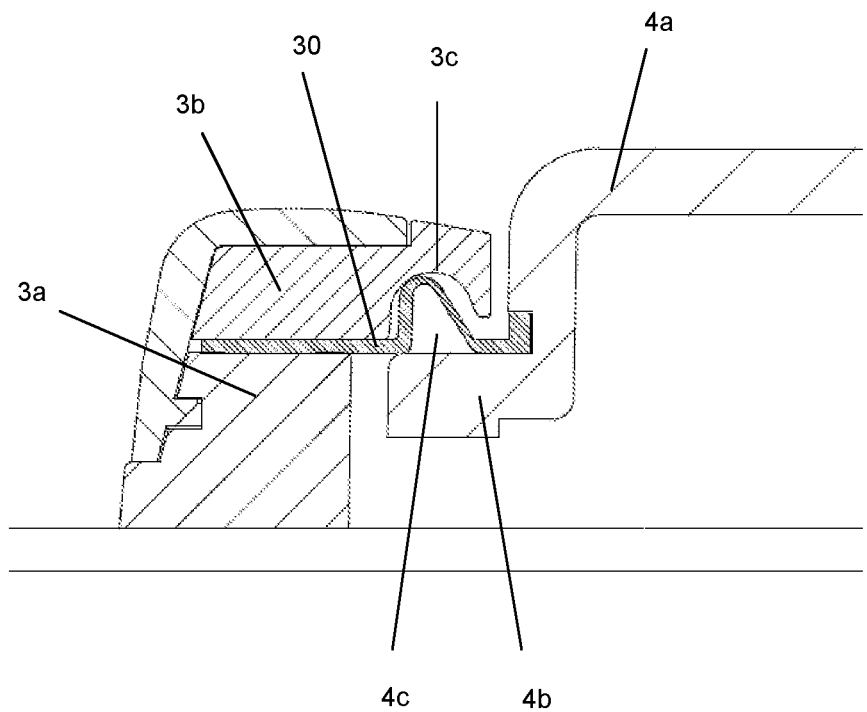
FIG. 8 shows a side component view according to another embodiment of the present invention, where the button assembly comprises an ingress protection membrane.

With reference to FIG. 8, the button assembly 1 comprises the same components as are present in the embodiment illustrated in FIGS. 1 to 4, except that it is modified to include an ingress protection membrane 30. The ingress protection membrane 30 may be made of any suitable material, e.g. flexible elastomer or rubber, and these will be known to a person skilled in the art.

The flange 3b and movable button 4 are modified such that the underside of the flange 3b includes a convex (U-shaped) receiving portion 3c and the annular flange lip 4b includes an upward projection 4c. The receiving portion 3c is adapted to receive the upward projection 4c. The membrane 30 is fixed between the base 3a and the flange 3b at one end, and connected to a portion of the step formed between the annular flange lip 4b and top portion 4a at the opposite end. This connection may be achieved using any suitable means, e.g. by use of an adhesive, as are known to a person skilled in the art. In the rest position the membrane conforms to the fitting between the movable button 4 and the flange 3b. In use, the membrane 30 provides a seal against material ingress, by prevention of material from passing between the flange 3b and the movable button 4.

Figure 2A:
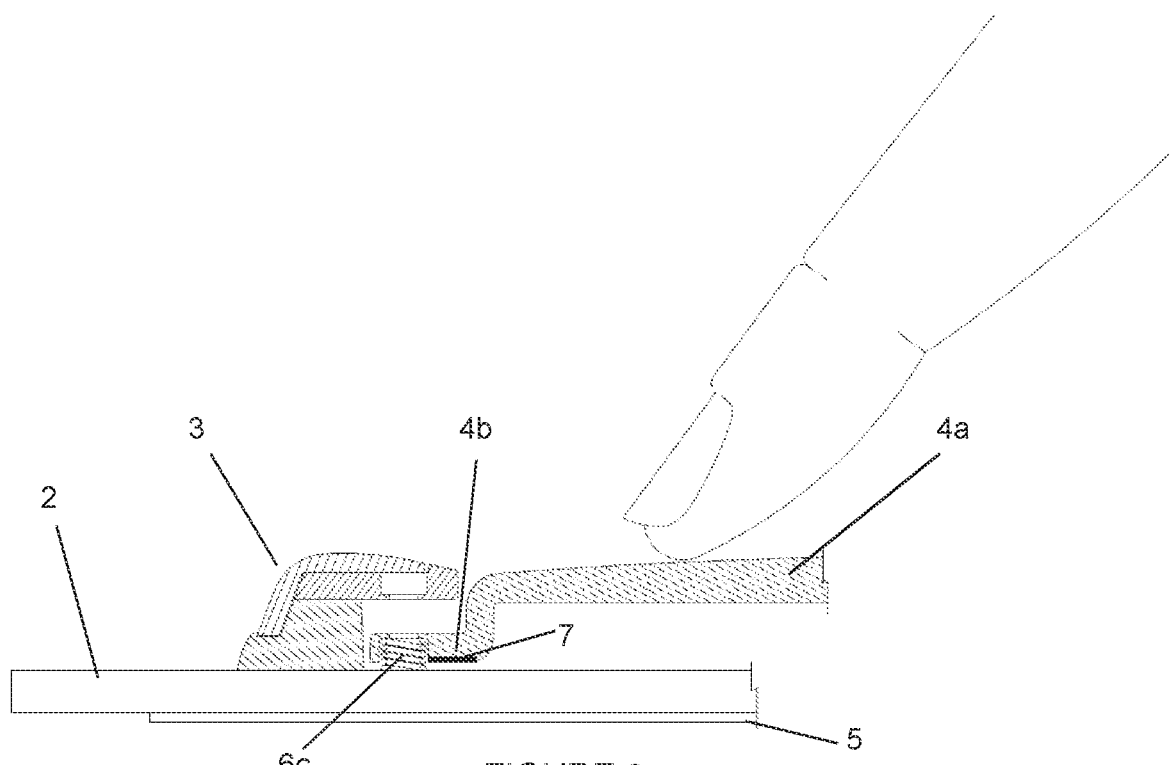
FIG. 2a shows a side view of the embodiment of FIG. 1a, where the movable button has been pressed by a user.
Figure 9:
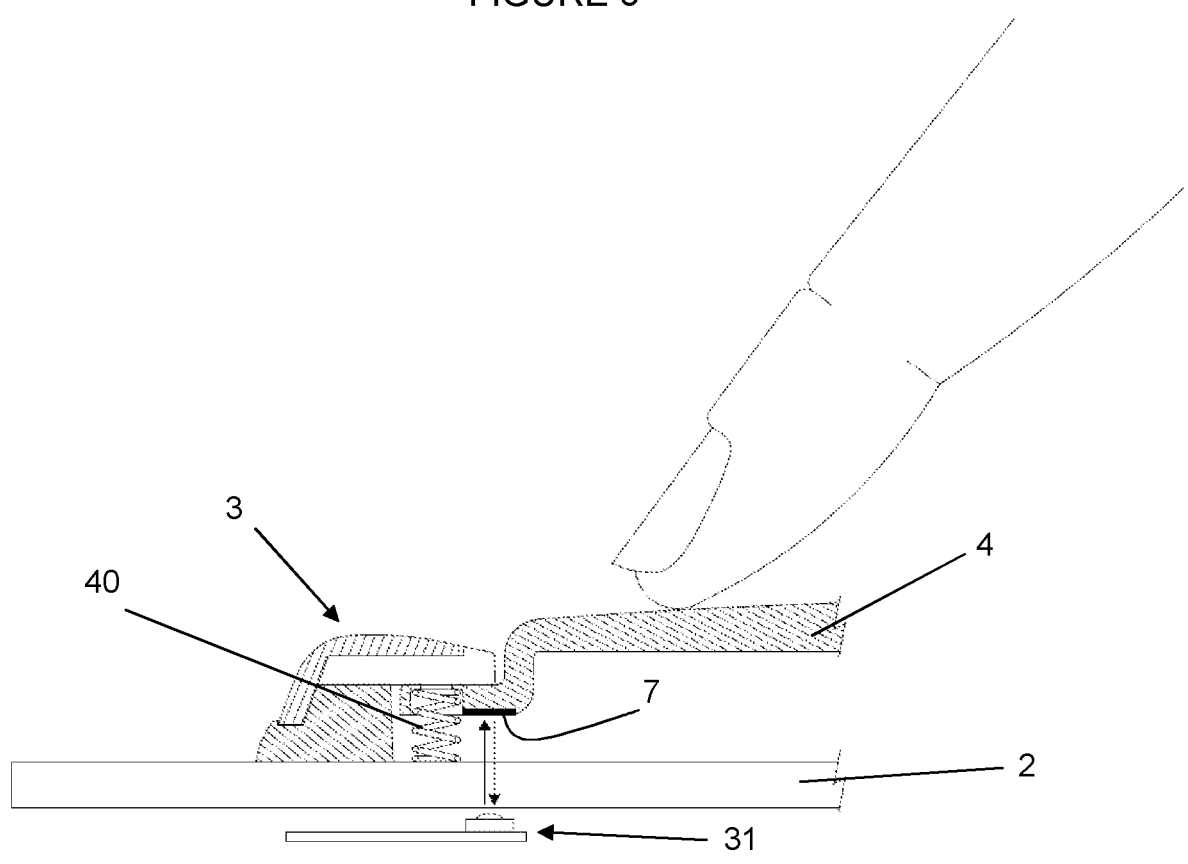
FIG. 9 is a side view of the configuration shown in FIG. 3a with a photo electric sensor located on an opposite side of the substrate prior to the movable button being pressed.
Figure 9A:
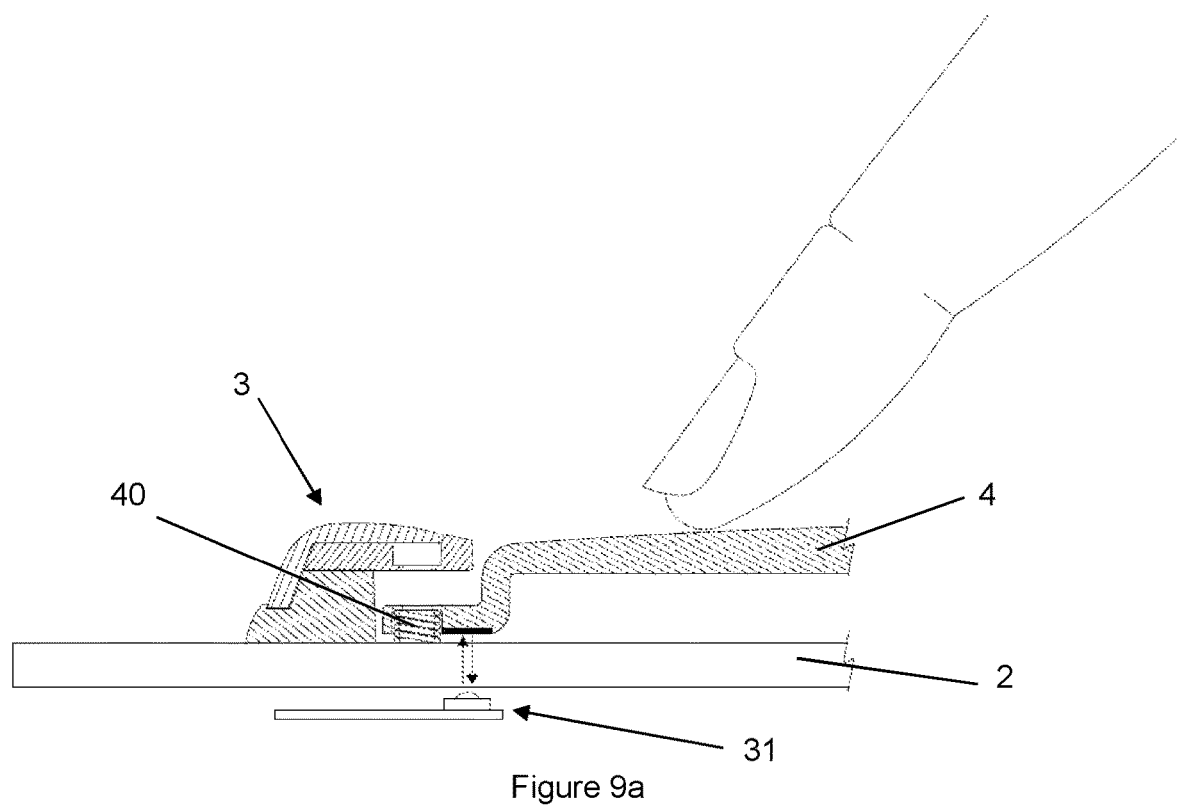
FIG. 9a shows the configuration illustrated in FIG. 10 but while the movable button is pressed.

FIGS. 9 and 9a show the button assembly of FIG. 2a with a photoelectric sensor 31 located relative to the detectable element 7 on the opposite side of the glass 2. FIG. 9 shows the moveable button 4 in the rest or home position about to be pressed and FIG. 9a shows the depression of the moveable button 4 against the biasing force of the spring which moves the detectable element 7 closer to the photoelectric sensor 31. The springs 40 shown in FIG. 9 in the extended configuration are compressed in FIG. 9a as the button is depressed.

Figure 10:
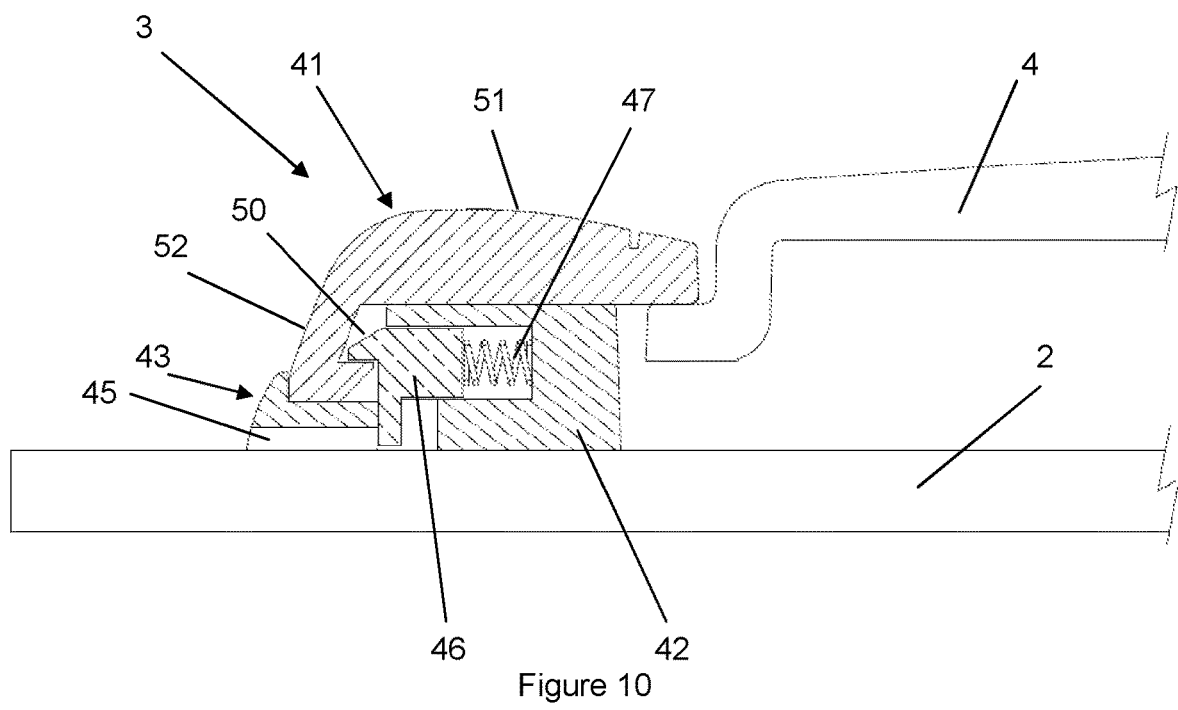
FIG. 10 is a side elevation view of another embodiment of the present invention.
Figure 10A:
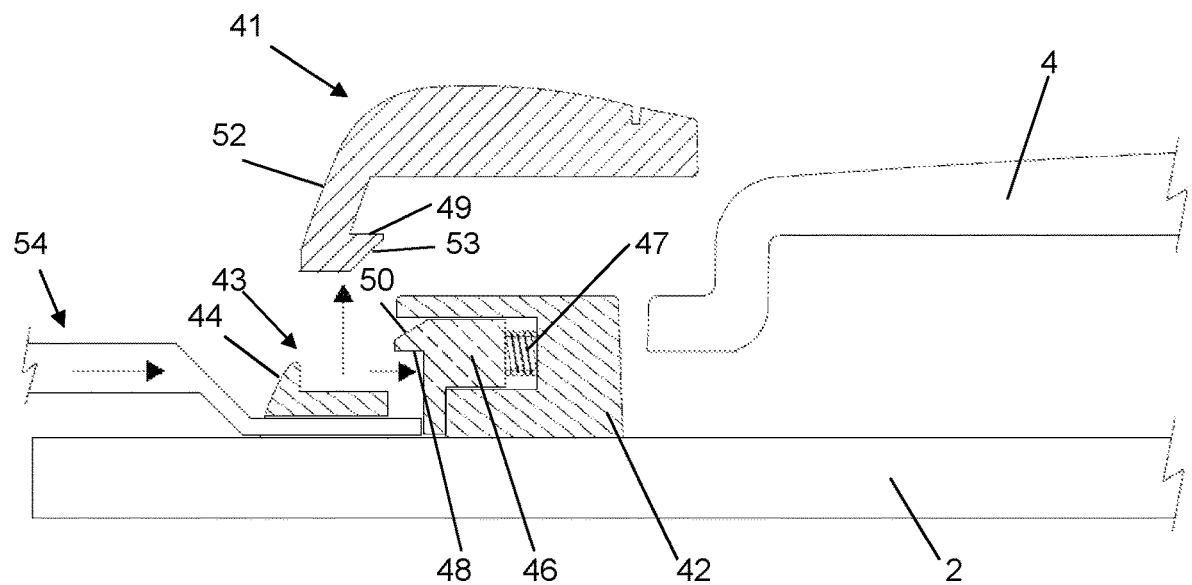
FIG. 10a shows the use of a tool to disengage the components of the embodiment illustrated in FIG. 10.

With reference to FIG. 10 and FIG. 10a, the button assembly 1 comprises a chassis 3 that mounts a movable button 4. The biasing spring 40, the detectable element 7 and the adhesive 8 used to attach the base to the glass 2. In this configuration, the chassis 3 includes a releasable engagement assembly to mount the button 4 relative to the chassis 3.

In this embodiment, the chassis 3 includes a base 42 with an outer bezel 41 removably attached relative to the base 42. The base 42 is attached to the glass substrate 2. The base 42 is annular in configuration, defining a central opening, spanned by the button 4.

The base 42 comprises an outer stop skirt 43. The stop skirt 43 extends radially on an outer side of the base 43. The stop skirt 43 is shaped to provide a surface to limit the movement of the outer bezel 41 toward the glass substrate 2. An outermost guide return 44 is provided to assist with the location of the outer bezel 41 relative to the base 42. As shown in FIG. 10, the lower edge of the stop skirt 43, at least in parts, is spaced from the glass substrate 2 such that an entryway 45 is formed.

The base 42 is associated with a mounting mechanism to removably mount the outer bezel 41 relative thereto. The mounting mechanism illustrated in FIGS. 10 and 10a includes a plurality of keys 46 spaced about the circumference of the base 42. The keys 46 are moveable radially relative to the base 42 in a direction toward to the central opening to attach and detach the outer bezel 41. The keys 46 are each biased radially outwardly by a biasing spring 47. In the extended position illustrated in FIG. 10, into which the keys 46 are biased, an engagement shoulder 48 provided on the key 46 engages an engagement shoulder 49 of the outer bezel 41 to hold the outer bezel 41 relative to the base 42.

An angled portion 50 is provided on the key 46 to allow any force on the bezel 41 directed toward the glass substrate 2, to be translated into lateral movement of the key 46 radially inwardly.

The outer bezel 41 of this embodiment is annular in configuration and unitary in construction, typically formed as a single member. The outer bezel 41 includes a flange portion 51 which extends laterally into the central opening defined by the base 42, to define an upper limit of movement of the button 4. An upper portion of the flange portion 51 is typically shaped or finished to provide an aesthetically pleasing finish to the button assembly.

The outer bezel 41 also includes a depending wall portion 52 extending at an angle from the flange portion 51. As illustrated, the depending wall portion 52 diverges radially outwardly from the flange portion 51. An outer surface of the depending wall portion 52 typically continues on from an outer surface of the flange portion 51.

The depending wall portion 52 includes an engagement shoulder 49 to engage with the key 46 to hold the outer bezel 41 relative to the base 42. An angled portion 53 is provided on the depending wall portion 52 to allow any force on the bezel 41 directed toward the glass substrate 2 to be translated into lateral movement of the key 46 radially inwardly.

In use, depression of the outer bezel 41 toward the glass substrate 2 causes the angled portion 53 of the outer bezel 41 to abut the angled portion 50 of the key 46, forcing the key 46 radially inwardly until the engagement shoulder 49 of the outer bezel 41 is aligned with the engagement shoulder 48 of the key 46, mounting the outer bezel 41 relative to the base 42. A tool 54 can be inserted through the entryway 45 beneath the stop skirt 43 to abut a portion of the key 46 to move the key 46 radially inwardly to disengage the engagement shoulders 48, 49, allowing separation of the outer bezel 41 and the button 4 from the base 42 for servicing and/or cleaning for example.

Figure 11:
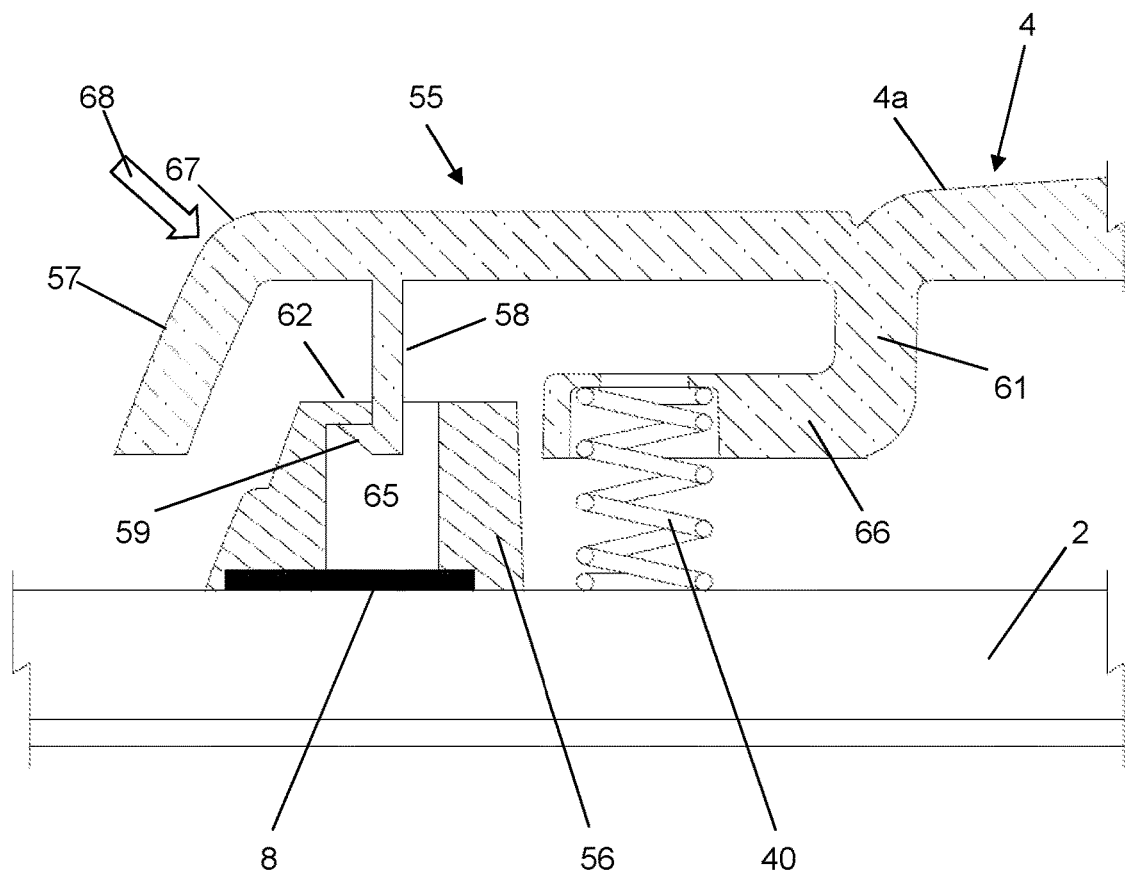
FIG. 11 is a side elevation view of another embodiment of the present invention with a single piece movable button, cover and bias mount.

In the embodiment illustrated in FIG. 11, the movable button 4 is provided with a radially extending cover portion 55 extending radially from the top portion 4a, to cover the base 56. An outer downturned lip 57 of the cover portion 55 is spaced from the base 56 and the substrate 2.

The base 56 includes an opening 65 with a lateral return 62 having an abutment shoulder (obstructed in FIG. 11) associated therewith.

The cover portion 55 also includes a depending wall portion 58 extending perpendicularly from an underside of the cover portion 55. The depending wall portion 58 includes an engagement shoulder (obstructed in FIG. 11) to engage with the abutment shoulder of the base 56. The depending wall portion 58 is provided with an angled portion 59 to allow and force on the button 4 or cover portion 55 directed toward the substrate to be translated into lateral deflection of the depending wall portion 55 radially inwardly to engage the button 4 with the base 56.

The movable button may be unitary in construction, typically formed as a single member.

The movable button 4 is provided with a depending shoulder 61 at the edge of the actuable portion of the moveable button 4. The depending shoulder 61 is associated with a radially extending mount 66 for mounting the biasing spring 40 relative to the glass substrate 2 and the movable button 4. The biasing spring 40 biases the engagement shoulder toward the abutment shoulder. The lateral return 62 will preferably abut the depending wall portion 58 to limit movement of the moveable button 4 to depression and return, and rotation.

In use, depression of the movable button 4 toward the glass substrate 2 causes the angled portion 59 of the depending wall 58 to abut the abutment shoulder of the base 56, forcing lateral deflection of the depending wall portion 58 radially inwardly until the engagement shoulder of the depending wall portion 58 is aligned with the abutment shoulder of the movable button, as shown in FIG. 11, attaching the movable button 4 relative to the base 56. This configuration also allows separation of the button 4 from the base by inward deflection of the depending wall portion 58 sufficiently to allow disengagement of the engagement shoulder of the depending wall portion 58 from the abutment shoulder of the base 56. This inward deflection of the depending wall portion 58 may be cause by pressing the downturned lip 57 inwardly or pressing corner 67 in the direction of the arrow 68.

The above embodiments are described by way of example only. Many variations are possible without departing from the scope of the invention as defined in the appended claims.

The invention claimed is:

1. A button assembly for a substrate, the button assembly comprising: a chassis attachable to the substrate; a movable button constrained by the chassis; one or more button sensors operable to sense the movable button; and one or more biasing assembly; wherein the one or more biasing assembly is arranged to bias the movable button towards a predetermined position, wherein the chassis comprises a base and a flange and the flange is releasably attached to the base.

2. A button assembly as claimed in claim 1, wherein the one or more biasing assembly comprises one or more springs.

3. A button assembly as claimed in claim 1, wherein the movable button is removably mounted relative to the chassis.

4. A button assembly as claimed in claim 1, wherein the chassis includes a base, an outer bezel with a laterally extending flange portion dimensioned to constrain the movable button and an engagement shoulder of the outer bezel, and at least one key associated with the base and movable between an extended position in which the at least one key is positioned to engage the engagement shoulder of the outer bezel and a retracted position in which the at least one key is free of the engagement shoulder of the outer bezel, the at least one key biased into the extended position.

5. A button assembly as claimed in claim 1, wherein the chassis includes a base with an abutment shoulder and the movable button with a laterally extending cover portion to cover the base, the cover portion provided with an engagement shoulder to releasably engage with the abutment shoulder of the base.

6. A button assembly as claimed in claim 1, wherein the substrate is arranged between the chassis and the one or more button sensors.

7. A button assembly as claimed claim 1, wherein the substrate comprises, or is provided over, a display screen, image projection means, or other illuminating means.

8. A button assembly as claimed in claim, 1 wherein the substrate comprises a touchscreen, touch display, or other touch device.

9. A button assembly as claimed in claim 1, wherein the chassis is securely fixed to the substrate.

10. A button assembly as claimed in claim 1, wherein the flange projects over, and the base projects under, a portion of the movable button so as to constrain the movable button between the flange and the base.

11. A button assembly as claimed in claim 1, wherein the movable button is operable to translate vertically, translate horizontally, slide, rotate and/or tilt.

12. A button assembly as claimed in claim 1, wherein the movable button is formed of, coated with, and/or plated with a conductive material, reflective material, magnetic material, or combinations thereof.

13. A button assembly as claimed in claim 1, wherein the movable button comprises one or more detectable elements for sensing by the one or more button sensors.

14. A button assembly as claimed in claim 1, wherein the button assembly comprises a rotary bezel and the one or more button sensors are operable to sense the rotary bezel.

15. A button assembly as claimed in claim 14, wherein the rotary bezel is formed of, coated with, and/or plated with, a conductive material, reflective material, magnetic material, or combinations thereof.

16. A button assembly as claimed in claim 14, wherein the rotary bezel comprises one or more detectable elements for sensing by the one or more button sensors.

17. A button assembly as claimed in claim 1, wherein the button assembly comprises a pivoting means about which the moveable button can pivot.

18. A button assembly as claimed in claim 1, wherein the movable button is provided with audio feedback means operable to output audible sound.

19. A machine comprising the button assembly according to claim 1, wherein the machine is an electronic machine.

* * * * *